(12) United States Patent
Liang et al.

(10) Patent No.: US 12,002,906 B2
(45) Date of Patent: Jun. 4, 2024

(54) SEMICONDUCTOR DEVICE AND SEMICONDUCTOR COMPONENT

(71) Applicant: EPISTAR CORPORATION, Hsinchu (TW)

(72) Inventors: Hao-Chun Liang, Hsinchu (TW); Wei-Shan Yeoh, Hsinchu (TW); Yao-Ning Chan, Hsinchu (TW); Yi-Ming Chen, Hsinchu (TW); Shih-Chang Lee, Hsinchu (TW)

(73) Assignee: EPISTAR CORPORATION, Hsinchu (TW)

( * ) Notice: Subject to any disclaimer, the term of this patent is extended or adjusted under 35 U.S.C. 154(b) by 357 days.

(21) Appl. No.: 17/406,521

(22) Filed: Aug. 19, 2021

(65) Prior Publication Data

US 2022/0059727 A1 Feb. 24, 2022

(30) Foreign Application Priority Data

Aug. 19, 2020 (TW) .................................. 109128192

(51) Int. Cl.
*H01L 33/44* (2010.01)
*H01L 31/02* (2006.01)
(Continued)

(52) U.S. Cl.
CPC ........ *H01L 33/44* (2013.01); *H01L 31/02005* (2013.01); *H01L 31/02161* (2013.01);
(Continued)

(58) Field of Classification Search
CPC ......... H01L 33/44; H01L 33/20; H01L 33/46; H01L 33/62; H01L 33/38;
(Continued)

(56) References Cited

U.S. PATENT DOCUMENTS 5,821,569 A * 10/1998 Dutta ...................... H01L 33/14
257/97
7,714,343 B2 5/2010 Unno et al.
(Continued)

FOREIGN PATENT DOCUMENTS

CN 109873067 A 6/2019
TW I657595 B 4/2019

*Primary Examiner* — Sitaramarao S Yechuri
(74) *Attorney, Agent, or Firm* — MUNCY, GEISSLER, OLDS & LOWE, P.C.

(57) ABSTRACT

The present disclosure provides a semiconductor device and a semiconductor component. The semiconductor device includes an active structure, a ring-shaped semiconductor contact layer, a first electrode, and an insulating layer. The active structure has a first-conductivity-type semiconductor layer, a second-conductivity-type semiconductor layer, and an active layer located between the first-conductivity-type semiconductor layer and the second-conductivity-type semiconductor layer. The ring-shaped semiconductor contact layer is located on the second-conductivity-type semiconductor layer and having a first inner sidewall and a first outer sidewall. The first electrode has an upper surface and covers the ring-shaped semiconductor contact layer. The insulating layer covers the first electrode and the active structure and has a second inner sidewall and a second outer sidewall. The first inner sidewall is not flush with the second inner sidewall in a vertical direction.

20 Claims, 6 Drawing Sheets

(51) Int. Cl.
<table>
<tr><td>H01L 31/0216</td><td>(2014.01)</td></tr>
<tr><td>H01L 31/0352</td><td>(2006.01)</td></tr>
<tr><td>H01L 33/20</td><td>(2010.01)</td></tr>
<tr><td>H01L 33/46</td><td>(2010.01)</td></tr>
<tr><td>H01L 33/62</td><td>(2010.01)</td></tr>
<tr><td>H01L 31/0224</td><td>(2006.01)</td></tr>
<tr><td>H01L 33/38</td><td>(2010.01)</td></tr>
</table>

(52) U.S. Cl.
CPC ...... *H01L 31/035272* (2013.01); *H01L 33/20* (2013.01); *H01L 33/46* (2013.01); *H01L 33/62* (2013.01); *H01L 31/022408* (2013.01); *H01L 33/38* (2013.01)

(58) Field of Classification Search
CPC ....... H01L 31/022408; H01L 31/02005; H01L 31/02161; H01L 31/035272; H01L 31/03046; H01L 31/105
See application file for complete search history.

(56) References Cited

U.S. PATENT DOCUMENTS

<table>
<tr><td>10,475,962 B2</td><td>11/2019</td><td>Yeh et al.</td><td></td></tr>
<tr><td>2012/0161113 A1*</td><td>6/2012</td><td>Lowenthal</td><td>H01L 24/97<br>257/E51.024</td></tr>
<tr><td>2013/0187193 A1*</td><td>7/2013</td><td>Lopez</td><td>H01L 33/38<br>257/99</td></tr>
</table>

* cited by examiner

SEMICONDUCTOR DEVICE AND SEMICONDUCTOR COMPONENT

CROSS REFERENCE TO RELATED APPLICATIONS

This application claims the right of priority based on TW application Serial No. 109128192, filed on Aug. 19, 2020, which is incorporated by reference herein in their entirety.

FIELD OF DISCLOSURE

The present disclosure relates to a semiconductor device and a semiconductor component and in particular to a semiconductor device having a semiconductor contact layer and a semiconductor component including the same.

BACKGROUND OF THE DISCLOSURE

With the development of technology, semiconductor materials (such as compound semiconductors) can be used in production of various semiconductor devices, and are widely applied in fields like illumination, medical care, display, communication, sensing, or power supply system. For example, a group III-V compound semiconductor material including group III and group V elements can be used in an optoelectronic semiconductor device such as a light-emitting diode (LED).

SUMMARY OF THE DISCLOSURE

The present disclosure provides a semiconductor device. The semiconductor device includes an active structure, a ring-shaped semiconductor contact layer, a first electrode, and an insulating layer. The active structure has a first-conductivity-type semiconductor layer, a second-conductivity-type semiconductor layer, and an active layer located between the first-conductivity-type semiconductor layer and the second-conductivity-type semiconductor layer. The ring-shaped semiconductor contact layer is located on the second-conductivity-type semiconductor layer and has a first inner sidewall and a first outer sidewall. The first electrode has an upper surface and covers the ring-shaped semiconductor contact layer. The insulating layer covers the first electrode and the active structure and has a second inner sidewall and a second outer sidewall. The first inner sidewall is not flush with the second inner sidewall in a vertical direction. The ring-shaped semiconductor contact layer is surrounded by the first electrode.

The present disclosure further provides a semiconductor component. The semiconductor component includes a semiconductor device and a welding wire. The semiconductor device includes an active structure, a ring-shaped semiconductor contact layer, a first electrode, and an insulating layer. The active structure has a first-conductivity-type semiconductor layer, a second-conductivity-type semiconductor layer, and an active layer located between the first-conductivity-type semiconductor layer and the second-conductivity-type semiconductor layer. The ring-shaped semiconductor contact layer is located on the second-conductivity-type semiconductor layer and has a first inner sidewall and a first outer sidewall. The first electrode has an upper surface and covers the ring-shaped semiconductor contact layer. The insulating layer covers the first electrode and the active structure and has a second inner sidewall and a second outer sidewall. The welding wire has a bonding portion bonded to the first electrode. The bonding portion has a bonding width. The second-conductivity-type semiconductor layer has a first portion not covered by the ring-shaped semiconductor contact layer. The first electrode has a second portion not covered by the insulating layer. The first inner sidewall defines a first geometric shape having a first width, and the second inner sidewall defines a second geometric shape having a second width. The second width is larger than the bonding width.

DETAILED DESCRIPTION OF THE DISCLOSURE

Figure 1A:
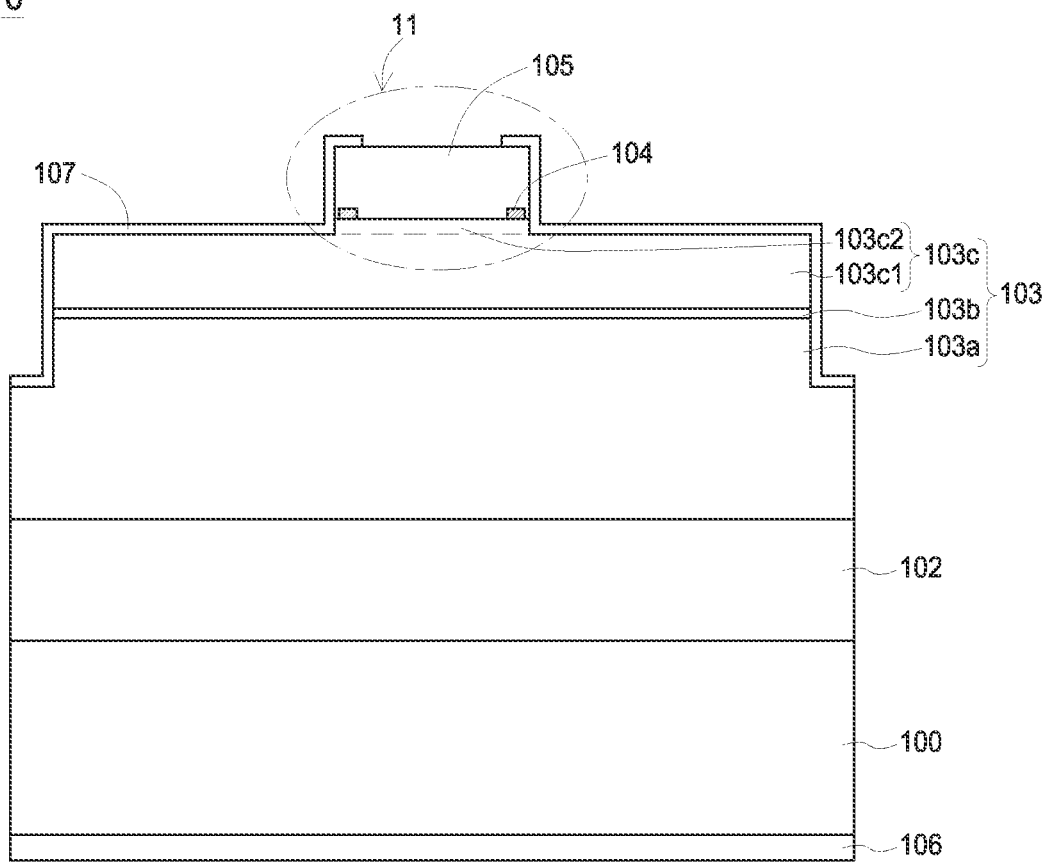
FIG. 1A shows a schematic sectional view of a semiconductor device in accordance with an embodiment of the present disclosure.

The following embodiments will be described with accompany drawings to disclose the concept of the present disclosure. In the drawings or description, same or similar portions are indicated with same numerals. Furthermore, a shape or a thickness of an element in the drawings may be enlarged or reduced. Particularly, it should be noted that an element which is not illustrated or described in drawings or description may be in a form that is known by a person skilled in the art.

A person skilled in the art can realize that addition of other elements based on a structure recited in the following embodiments is allowable. For example, if not otherwise specified, a description similar to "a first layer/structure is on or under a second layer/structure" may include an embodiment in which the first layer/structure directly (or physically) contacts the second layer/structure, and may also include an embodiment in which another structure is provided between the first layer/structure and the second layer/structure, such that the first layer/structure and the second layer/structure do not physically contact each other. In addition, it should be realized that a positional relationship of a layer/structure may be altered when being observed in different orientations.

Figure 1B:
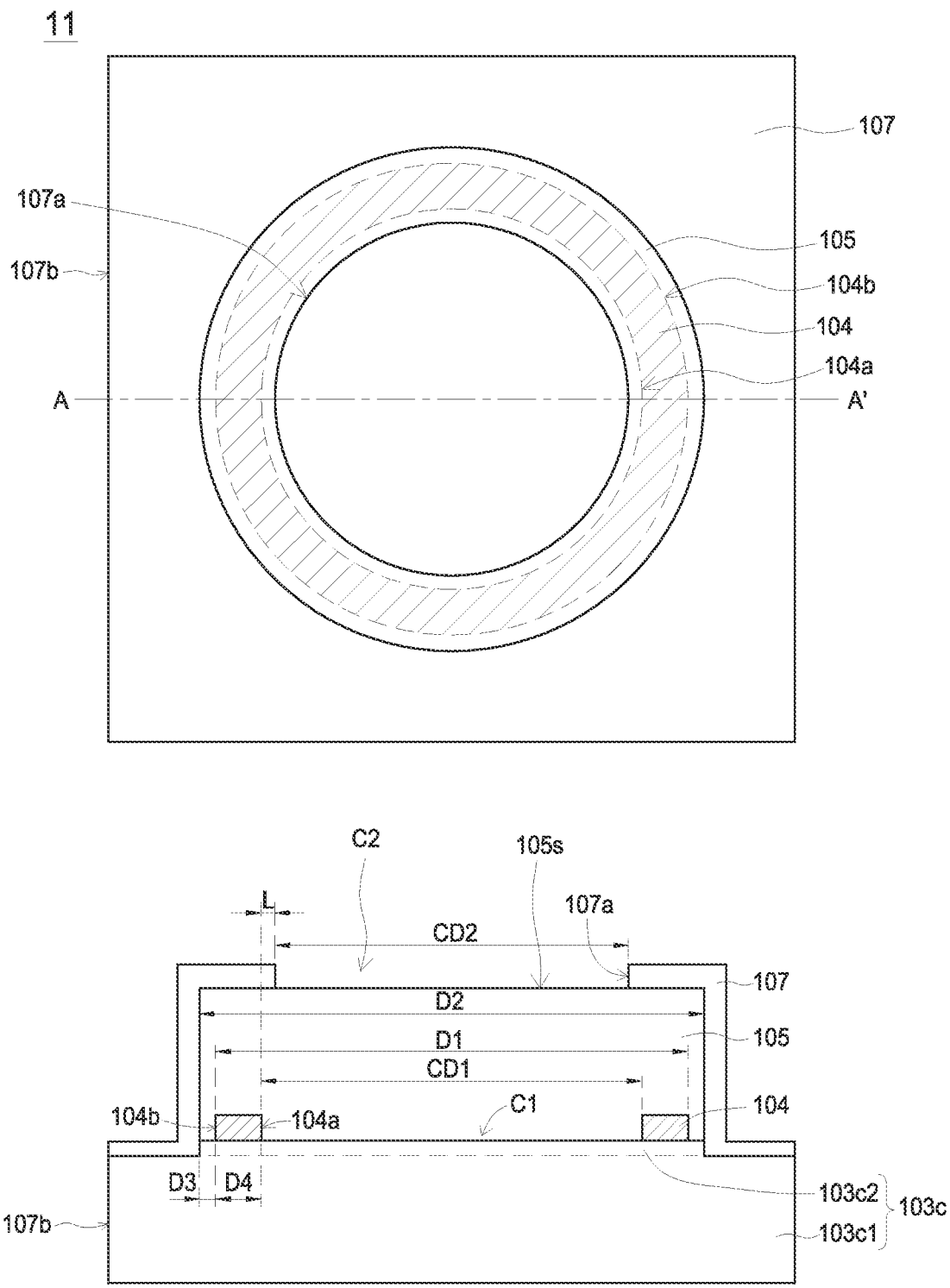
FIG. 1B shows a partial enlarged view in FIG. 1A, in which an upper part in FIG. 1B shows a schematic top view, and a lower part in FIG. 1B shows a schematic sectional view along A-A' line.

FIG. 1A shows a schematic sectional view of a semiconductor device 10 in accordance with an embodiment of the present disclosure. FIG. 1B shows a partial enlarged view in FIG. 1A, in which the upper part in FIG. 1B shows a schematic top view and the lower part in FIG. 1B shows a schematic sectional view along A-A' line. The semiconductor device 10 includes a base 100, an intermediate layer 102, an active structure 103, a semiconductor contact layer 104, a first electrode 105, an insulating layer 107, and a second electrode 106. A dashed-line region 11 including the first electrode 105 and the semiconductor contact layer 104 is indicated in FIG. 1A. The base 100 may be a conductive substrate which includes a conductive material, such as gallium arsenide (GaAs), indium phosphide (InP), silicon carbide (SiC), gallium phosphide (GaP), zinc oxide (ZnO), gallium nitride (GaN), aluminum nitride (AlN), germanium (Ge) or silicon (Si). The intermediate layer 102 is located between the base 100 and the active structure 103. Based on the design requirements of the semiconductor device 10, the intermediate layer 102 may facilitate lattice growth, strain adjustment, structural bonding, electrical contact, optical reflection, and/or current spreading. To achieve the above-mentioned functions, the intermediate layer 102 may include materials and/or structures correspondingly, which are known by a person skilled in the art so the details are not described herein.

The active structure 103 is located on the intermediate layer 102 and has a first-conductivity-type semiconductor layer 103a, an active layer 103b, and a second-conductivity-type semiconductor layer 103c sequentially formed on the intermediate layer 102. The semiconductor contact layer 104 is located on the second-conductivity-type semiconductor layer 103c of the active structure 103 and covers a portion of the second-conductivity-type semiconductor layer 103c. When viewed from the top of the semiconductor device 10, as shown in the top view of FIG. 1B, the semiconductor contact layer 104 has a closed ring shape (or closed loop shape) such as a circular ring shape. The first electrode 105 covers the semiconductor contact layer 104. For example, the first electrode 105 has a circular shape and covers all sidewalls and upper surface(s) of the semiconductor contact layer 104. Specifically, the semiconductor contact layer 104 is surrounded by the first electrode 105. In an embodiment, the first electrode 105 may physically contact all sidewalls and upper surface(s) of the semiconductor contact layer 104. In this embodiment, when viewed from above, the semiconductor contact layer 104 has an inner sidewall 104a and an outer sidewall 104b. The inner sidewall 104a may define a first opening C1 (that is, the inner sidewall 104a is the boundary of the first opening C1). The outer sidewall 104b and the inner sidewall 104a may have the same or different geometric shapes. In this embodiment, as shown in the upper part of FIG. 1B, both the inner sidewall 104a and the outer sidewall 104b have circular shapes so the first opening C1 also has a circular shape. In the embodiment, the geometric shape defined by the outer sidewall 104b has a width D1 which may be the maximum width in the geometric shape. In the embodiment, the width D1 is an outer diameter of the ring-shaped semiconductor contact layer 104. In the embodiment, the semiconductor contact layer 104 has a width D4, which is the distance between the outer sidewall 104b and the inner sidewall 104a as shown in FIG. 1B. Specifically, the width D4 may be defined as the maximum distance between the outer sidewall 104b and the inner sidewall 104a. In an embodiment, the width D1 is, for example, 75 μm to 120 μm. The width D4 is, for example, 3 μm to 15 μm. The geometric shape defined by the inner sidewall 104a has a width CD1 (as shown in FIG. 1B). In this embodiment, the width CD1 is the maximum width in the geometric shape defined by the inner sidewall 104a, which is also an inner diameter of the ring-shaped semiconductor contact layer 104 (or the diameter of the first opening C1) in this embodiment. The first electrode 105 covers and fills the first opening C1 and is in direct contact with the second-conductivity-type semiconductor layer 103c. That is, the second-conductivity-type semiconductor layer 103c has a first portion not covered by the semiconductor contact layer 104. The first portion is in direct contact with the first electrode 105. In an embodiment, the width CD1 is not less than 60 μm, for example, 60 μm to 100 μm.

As shown in FIGS. 1A and 1B, the insulating layer 107 covers the first electrode 105 and the active structure 103. The first electrode 105 has a second portion not covered by the insulating layer 107. From the top view, the insulating layer 107 has an inner sidewall 107a and an outer sidewall 107b. The inner sidewall 107a may define a second opening C2 (that is, the inner sidewall 107a is the boundary of the second opening C2). The outer sidewall 107b and the inner sidewall 107a may have the same or different geometric shapes. In the embodiment, as shown in the upper part of FIG. 1B, the outer sidewall 107b has a rectangular shape and the inner sidewall 107a has a circular shape so the second opening C2 also has a circular shape. In the embodiment, the geometric shape defined by the inner sidewall 107a has a width CD2 as shown in FIG. 1B. In this embodiment, the width CD2 is the maximum width in the geometric shape defined by the inner sidewall 107a, which is also the diameter of the second opening C2 in this embodiment. In FIG. 1B, the inner sidewall 107a of the insulating layer 107 does not overlap with the inner sidewall 104a of the semiconductor contact layer 104 in a vertical direction. As shown in the lower part of FIG. 1B, the inner sidewall 104a is not flush with the inner sidewall 107a in the vertical direction. In the embodiment, the inner sidewall 107a and the inner sidewall 104a are separated by a distance L in a horizontal direction when the inner sidewall 107a and the inner sidewall 104a are orthogonally projected on an upper surface 105s of the first electrode 105. That is, the boundary of the first opening C1 and the boundary of the second opening C2 are separated by the distance L in a horizontal direction. In an embodiment, the distance L may be in a range greater than 0 μm and less than 5 μm. For example, the distance L may be in a range from 1 μm to 3 μm. In another embodiment, the inner sidewall 107a may be flush with the inner sidewall 104a in a vertical direction (i.e. the inner sidewall 107a and the inner sidewall 104a are not separated when being orthogonally projected on an upper surface 105s). In the embodiment, the outer sidewall 104b is not flush with the inner sidewall 107a in the vertical direction. A portion of the upper surface of the first electrode 105 is not covered by the insulating layer 107. In the embodiment, when viewed from the top of the semiconductor device 10, as shown in the upper part of FIG. 1B, the inner sidewall 107a is only located inside the inner sidewall 104a. The width CD1 is greater than the width CD2. In an embodiment, the width CD2 is not less than 55 μm. For example, the width CD2 is in a range from 55 μm to 115 μm. In the top view, an area of the second opening C2 (or the area defined by the inner sidewall 107a) is not less than 2375 μm$^2$. For example, the area is in a range from 2800 μm$^2$ to 10000 μm$^2$. In an embodiment, when viewed from the top of the semiconductor device 10, as shown in the upper part of FIG. 1B, the inner sidewall 104a and the inner sidewall 107a respectively have a geometric shape, such as a circle or a rectangle. The geometric shapes of the inner sidewall 104a and the inner sidewall 107a may have the same geometric center.

As shown in FIG. 1A and the lower part of FIG. 1B, the first electrode 105 is located on the active structure 103 and the semiconductor contact layer 104, and the first electrode 105 has a width D2 greater than the width D1 of the semiconductor contact layer 104. From the top view, the first electrode 105 has a geometric shape, such as a circle or a rectangle. In the embodiment, the first electrode 105 has almost the same geometric center as that of the inner sidewall 104a and/or the inner sidewall 107a. In an embodiment, the width CD2 is greater than or equal to 80% of the width D2. For example, the width CD2 is greater than or equal to 90% of the width D2 and less than the width D2. From the top view, the insulating layer 107 covers an edge of the upper surface 105s of the first electrode 105, and a portion of the first electrode 105 close to the geometric center of the first electrode 105 is not covered by the insulating layer 107. In an embodiment, on the upper surface 105s of the first electrode 105, the proportion of the area occupied by the insulating layer 107 is less than or equal to 30%. For example, the proportion is less than 20%. In an embodiment, the width D2 is not less than 100 µm, such as in a range from 120 µm to 150 µm. In this embodiment, the first electrode 105 fills the first opening C1 and covers the semiconductor contact layer 104. The thickness of the first electrode 105 is not less than 3 µm, such as in a range from 3 µm to 10 µm. In some embodiments, when the thickness of the first electrode 105 is 3 µm or more, the yield rate of the semiconductor device 10 can be further improved. In some embodiments, when the thickness of the first electrode 105 exceeds 10 µm, the material cost in the manufacturing process of the first electrode 105 may be too high.

The second-conductivity-type semiconductor layer 103c has a bottom portion 103c1 and a protrusion portion 103c2 protruding from the bottom portion 103c1. The first electrode 105 is located on the protrusion portion 103c2 and the width D2 of the first electrode 105 is less than the width of the bottom portion. The width of the protrusion portion 103c2 may be equal to the width D2 of the first electrode 105. A sidewall of the protrusion portion 103c2 may be flush with the sidewall of the first electrode 105. In this embodiment, the insulating layer 107 covers the upper surface 105s and the sidewall of the first electrode 105, and the sidewalls of the protrusion portion 103c2 of the second-conductive-type semiconductor layer 103c and the active structure 103. Specifically, the insulating layer 107 may be continuously distributed from the upper surface 105s to the sidewall of the active structure 103. As shown in the lower part of FIG. 1B, the sidewall of the semiconductor contact layer 104 is separated from the sidewall of the first electrode 105 by a distance D3. The semiconductor contact layer 104 and the insulating layer 107 are not in direct contact and are separated by the distance D3. In an embodiment, the distance D3 may be in a range from 1 µm to 10 µm. The material of the bottom portion 103c1 and the protrusion portion 103c2 may be the same or different. In an embodiment, when the material of the bottom portion 103c1 and the protrusion portion 103c2 are different, an obvious interface between the bottom portion 103c1 and the protrusion portion 103c2 may be observed when analyzing the bottom portion 103c1 and the protrusion portion 103c2 with an electron microscope such as a SEM (scanning electron microscope).

In some embodiments, the first electrode 105 covers all the sidewalls and upper surface(s) of the semiconductor contact layer 104, thereby protecting the material of the semiconductor contact layer 104 and avoiding the material of the semiconductor contact layer 104 from being reacted (such as being oxidized) during manufacturing processes that may result in poor photoelectric characteristics of the semiconductor device 10.

In an embodiment, when viewed from the top of the semiconductor device 10, the geometric center(s) of the first electrode 105 and/or the geometric center of the semiconductor contact layer 104 overlap(s) with the geometric center of the semiconductor device 10. The second electrode 106 is formed on a bottom surface of the base 100, wherein the first electrode 105 and the second electrode 106 electrically connect to two terminals of an external device or a power source. In an embodiment, the semiconductor device 10 may be a light-emitting diode chip, a laser diode chip, or a photodiode chip.

Figure 2A:
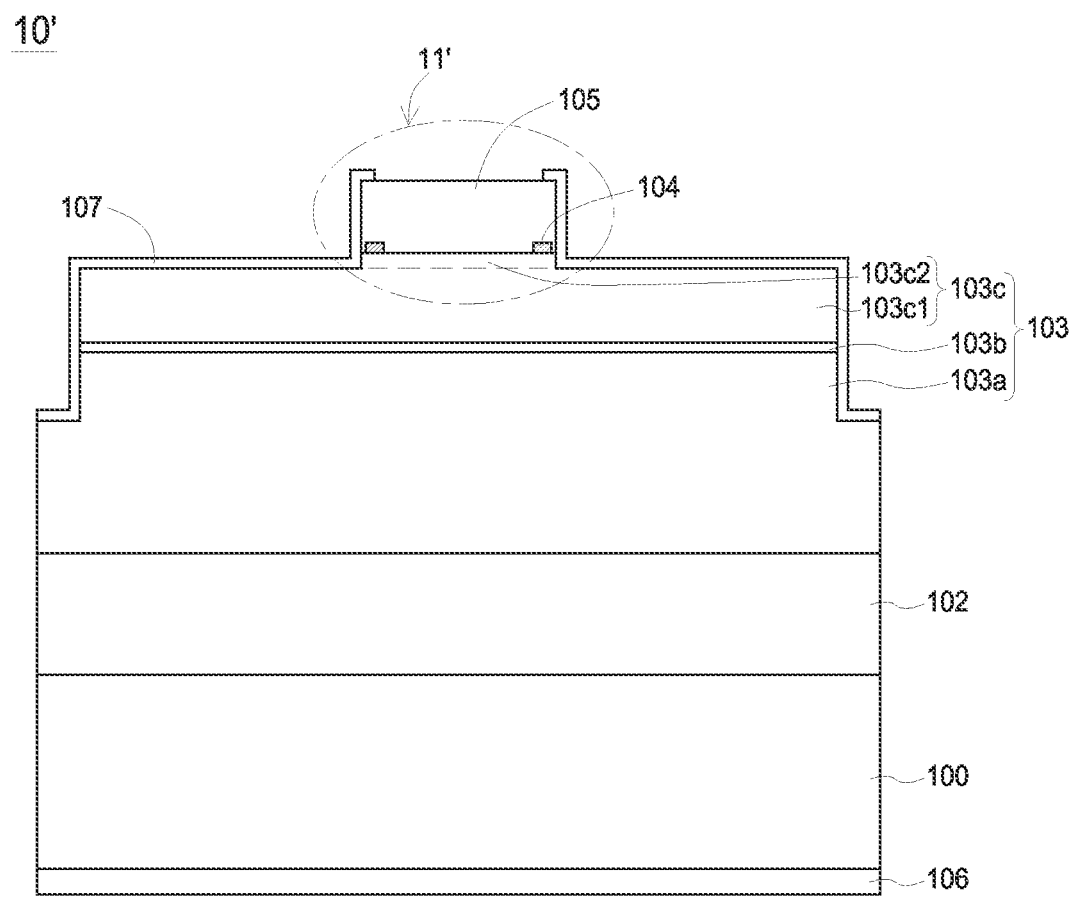
FIG. 2A shows a schematic sectional view of a semiconductor device in accordance with an embodiment of the present disclosure.
Figure 2B:
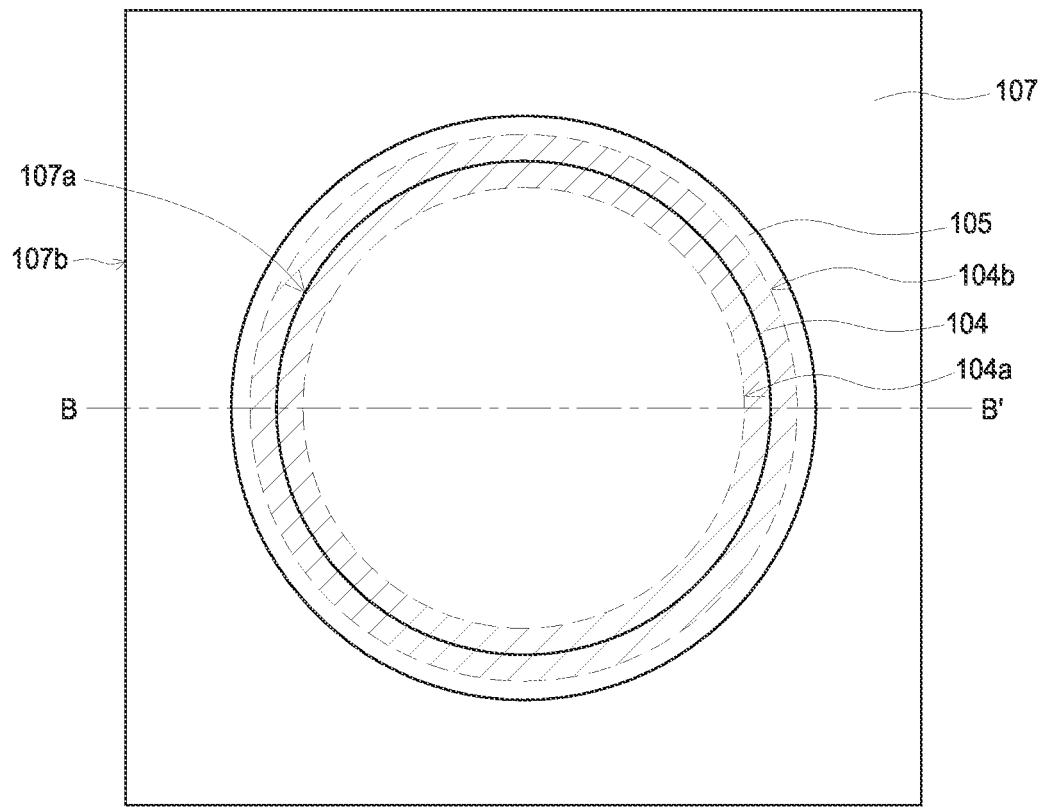
FIG. 2B shows a partial enlarged view in FIG. 2A, in which an upper part in FIG. 2B shows a schematic top view, and a lower part in FIG. 2B shows a schematic sectional view along B-B' line.
Figure 2B:
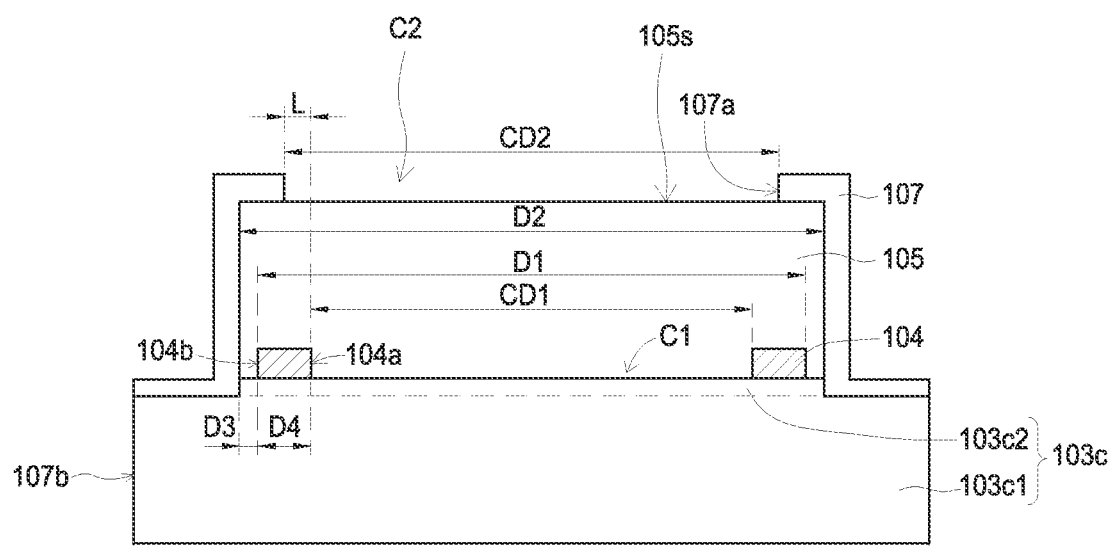

Please refer to FIG. 2A and FIG. 2B, wherein FIG. 2A shows a schematic sectional view of a semiconductor device 10' in accordance with an embodiment of the present disclosure. FIG. 2B shows a partial enlarged view in FIG. 2A, in which an upper part in FIG. 2B shows a schematic top view, and a lower part in FIG. 2B shows a schematic sectional view along B-B' line. A dashed-line region 11' including the first electrode 105 and the semiconductor contact layer 104 is indicated in FIG. 1A. One difference between the semiconductor device 10' and the semiconductor device 10 is that when viewed from above of the semiconductor device 10', as shown in FIG. 2B, the inner sidewall 104a of the semiconductor contact layer 104 is closer to the geometric center of the second opening C2 than the inner sidewall 107a of the insulating layer 107. That is, the inner sidewall 104a is only located inside the inner sidewall 107a, and the width CD2 is greater than the width CD1. Therefore, the contact area between the semiconductor contact layer 104 and the second-conductivity-type semiconductor layer 103c can be increased to further reduce the contact resistance. In an embodiment, the distance L is less than 5% of the width CD2, and the width CD1 is greater than 90% of the width CD2. With this design, a good contact resistance can be maintained between the semiconductor contact layer 104 and the second-conductivity semiconductor layers 103c, and the semiconductor contact layer 104 may be prevented from being too close to the geometric center of the second opening C2 in the horizontal direction, which may affect the yield rate during a subsequent package process such as wire bonding. In addition, as shown in the lower part of FIG. 2B, the inner sidewall 107a of the insulating layer 107 overlaps with the semiconductor contact layer 104 in the vertical direction. The content and structural variations of positions, spatial relationships, and material compositions of other layers or structures in this embodiment have been described in detail in the previous embodiments and will not be repeated herein.

Figure 3A:
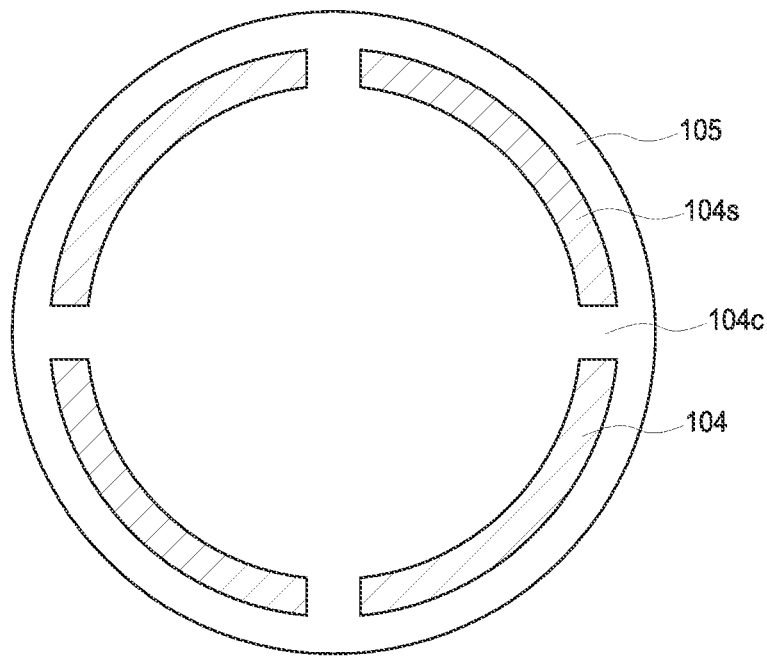
FIG. 3A and FIG. 3B are schematic top views respectively showing a semiconductor contact layer and a first electrode in accordance with an embodiment of the present disclosure.
Figure 3B:
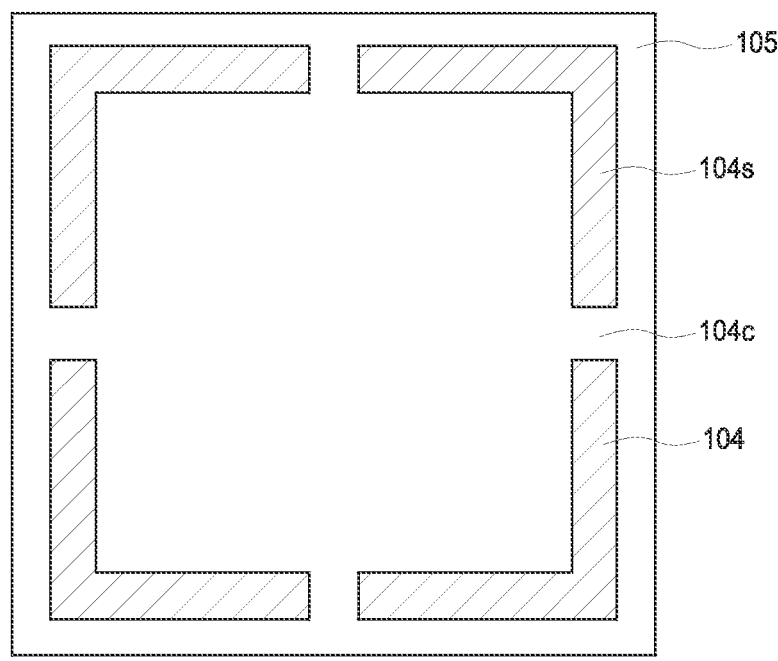

In some embodiments, the semiconductor contact layer 104 and the first electrode 105 may have other shapes and structures. FIG. 3A and FIG. 3B are schematic top views respectively showing a semiconductor contact layer and a first electrode in accordance with an embodiment of the present disclosure. In the embodiment, the semiconductor contact layer 104 has an open ring shape. For example, the semiconductor contact layer 104 may have one or more disconnection portion(s) 104c forming an open ring shape. As shown in FIGS. 3A and 3B, the semiconductor contact layer 104 may include a plurality of island-shaped structures 104s which are separated from each other. Each disconnection portion 104c separates two adjacent island-shaped structures 104s. In an embodiment, the number of the island-shaped structures 104s may be in the range of 2 to 6, such as 3, 4, or 5. The first electrode 105 has a circular shape and may cover all the sidewalls and upper surface(s) of the semiconductor contact layer 104. By having a plurality of island-shaped structures 104s separated from each other, the contact surface area between the first electrode 105 and the semiconductor contact layer 104 can be increased, thereby further reducing the contact resistance between the first electrode 105 and the semiconductor contact layer 104. As shown in FIG. 3B, the semiconductor contact layer 104 can have an open square ring shape and include a plurality of island-like structures 104s, and the first electrode 105 can have a square shape and cover all the sidewalls and upper surface(s) of the semiconductor contact layer 104.

Figure 4:
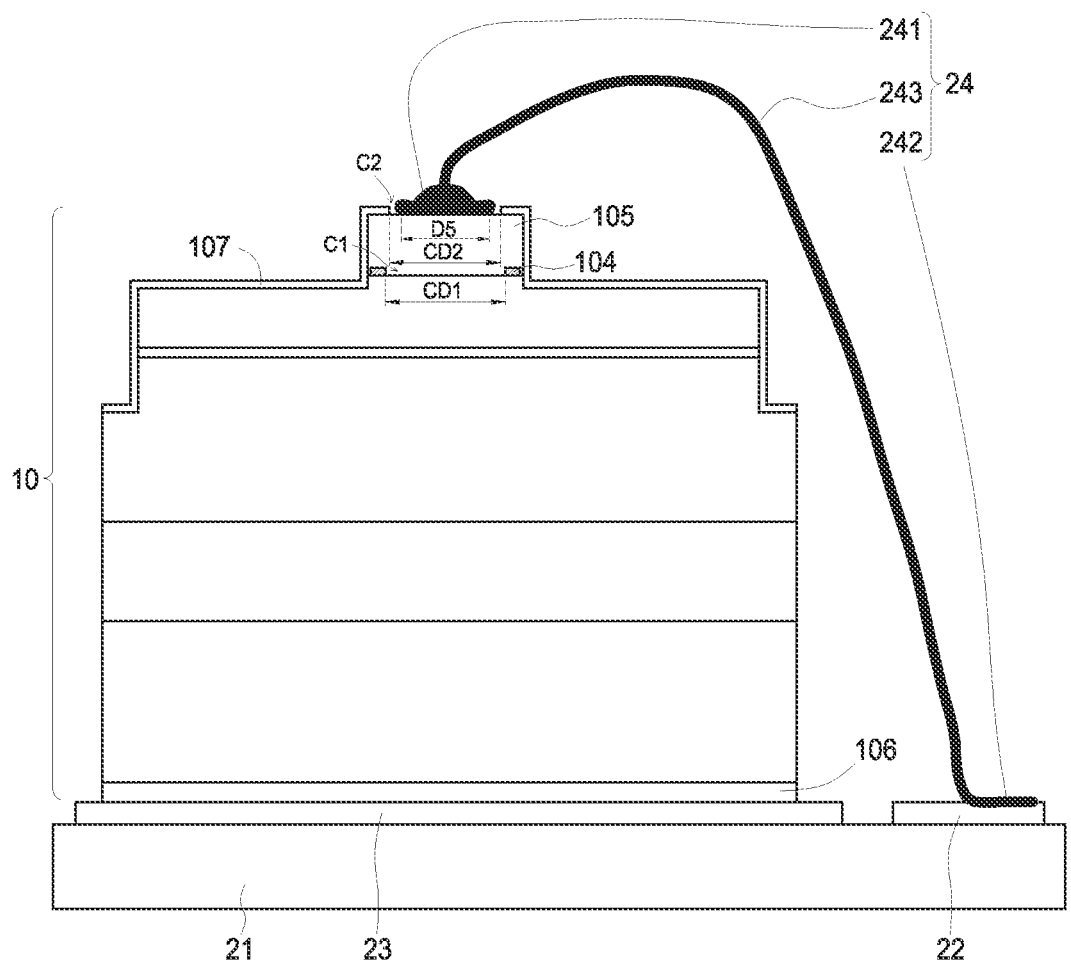
FIG. 4 shows a schematic sectional view of a semiconductor component in accordance with an embodiment of the present disclosure.

FIG. 4 shows a schematic view of a semiconductor component 20 in accordance with an embodiment of the present disclosure. The semiconductor component 20 includes the semiconductor device 10 as described above, and further includes a carrier 21, a first bonding pad 22, a second bonding pad 23, and a welding wire 24. The detailed structure of the semiconductor device 10 has been described above and will not be repeated herein. The welding wire 24 includes a first bump 241, a second bump 242, and a wire body 243 connected to the first bump 241 and the second bump 242. The first bump 241, the second bump 242 and the wire body 243 are electrically connected. The first bonding pad 22 is located on the carrier 21 and is electrically connected to the first electrode 105 through the welding wire 24. The first bump 241 of the welding wire 24 is bonded to the first electrode 105 of the semiconductor device 10, and the second bump 242 of the welding wire 24 is bonded to the first bonding pad 22 of the carrier 21. The second bonding pad 23 is located on the carrier 21 and is bonded to the second electrode 106 of the semiconductor device 10. As shown in FIG. 4, the bonded portion between the welding wire 24 and the first electrode 105 has a bonding width D5, in which the width CD2 in the semiconductor device 10 is greater than the bonding width D5. The bonding width D5 may be in the range of 50 μm to 100 μm, such as about 60 μm, 70 μm, 80 μm, or 90 μm. In an embodiment, when viewed from the top, the bonded portion where the welding wire 24 is connected to the upper surface of the first electrode 105 occupies less than or equal to 90% of the area of the upper surface of the first electrode 105, for example. The carrier 21 may be a package submount or a printed circuit board (PCB). Each of the first bonding pad 22 and the second bonding pad 23 includes a single-layered or a multi-layered metal structure and includes one or more materials selected from nickel (Ni), titanium (Ti), platinum (Pt), palladium (Pd), silver (Ag), gold (Au), aluminum (Al) or copper (Cu). In an embodiment, the first bump 241, the second bump 242, and the wire body 243 of the welding wire 24 include the same metal material, such as gold (Au), silver (Ag), aluminum (Al), or copper (Cu). The first bump 241, the second bump 242, and the wire body 243 of the welding wire 24 may be integrally formed.

It should be noted that although the semiconductor component 20 in FIG. 4 is described with the semiconductor device 10, those skilled in the art should understand that the semiconductor device 10' is also applicable to the structure as shown in FIG. 4.

The material and/or structural design of the semiconductor device 10 disclosed in the present disclosure may reduce the cracking or peeling of the semiconductor contact layer 104 caused by the pressure or stress generated from bonding the welding wire 24 to the first electrode 105. Specifically, when bonding the welding wire 24 to the first electrode 105 in a bonding process, the first bump 241 is formed to increase a bonding area and a bonding strength with the first electrode 105. In some embodiments, by setting the bonding width D5 of the first bump 241 to be smaller than the width CD2, and/or by setting the width CD1 to be greater than 90% of the width CD2, a good contact resistance between the semiconductor contact layer 104 and the second-conductivity-type semiconductor layer 103c can be maintained, and cracking of the semiconductor contact layer 104 that results from excessive inward extension of the semiconductor contact layer 104 when bonding the welding wire 24 to the first electrode 105 can be prevented, thereby improving the yield rate of the semiconductor device 10.

In an embodiment, the base 100 may be an epitaxial substrate for the epitaxial growth of the intermediate layer 102, the active structure 103, and the semiconductor contact layer 104 by a method such as metal organic chemical vapor deposition (MOCVD). In an embodiment, the semiconductor device 10 is a light-emitting diode chip, and the light from the active layer 103a of the semiconductor device 10 is emitted toward the insulating layer 107. The base 100 may contain a transparent or an opaque material depending on the actual needs. In another embodiment, the base 100 may be a bonding substrate, and the intermediate layer 102 includes a bonding material, such as a metal or a polymer material, for bonding the base 100 to the active structure 103. The active structure 103 may be epitaxially grown on an epitaxial substrate, and the epitaxial substrate is then removed after bonding the active structure 103 to the base 100 through the intermediate layer 102. Therefore, the semiconductor device 10 does not have the epitaxial substrate in an embodiment.

In the foregoing embodiments, the first-conductivity-type semiconductor layer 103c has a first conductivity type and the second-conductivity-type semiconductor layer 103c has a second conductivity type different from the first conductivity type. In an embodiment, the first conductivity type is p-type so that the first-conductivity-type semiconductor layer 103a can provide holes, and the second conductivity type is n-type so that the second-conductivity-type semiconductor layer 103c can provide electrons, and the electrons and holes are combined in the active layer 103b to emit a light with a specific wavelength. In another embodiment, the first conductivity type is n-type so that the first-conductivity-type semiconductor layer 103a can provide electrons, and the second conductivity type is p-type so that the second-conductivity-type semiconductor layer 103c can provide holes, and the electrons and holes are combined in the active layer 103b to emit a light with a specific wavelength.

In the foregoing embodiments, the intermediate layer 102, the first-conductivity-type semiconductor layer 103a, the active layer 103b, the second-conductivity-type semiconductor layer 103c, and the semiconductor contact layer 104 may include the same series of III-V compound semiconductor materials, such as AlInGaAs series, AlGaInP series or AlInGaN series. Among them, the AlInGaAs series may represent $(Al_{x1}In_{(1-x1)})_{1-x2}Ga_{x2}As$, the AlInGaP series may represent $(Al_{y1}In_{(1-y1)})_{1-y2}Ga_{y2}P$, and the AlInGaN series may represent $(Al_{z1}In_{(1-z1)})_{1-z2}Ga_{z2}N$, in which $0 \leq x1$, y1, $z1 \leq 1$, $0 \leq x2$, y2, and $z2 \leq 1$. In an embodiment, the semiconductor device 10 is a light-emitting diode chip, and a peak wavelength of the light emitted by the semiconductor device 10 is determined by the material composition of the active layer 103b. For example, when the material of the active layer 103b includes AlGaInP series, the emitted light may be an infrared light with a peak wavelength from 700 to 1700 nm, a red light with a peak wavelength from 610 nm to 700 nm, or a yellow light with a peak wavelength from 530 nm to 570 nm. When the material of the active layer 103b includes InGaN series, the emitted light may be a blue light or a deep blue light with a peak wavelength of 400 nm to 490 nm, or a green light with a peak wavelength of 490 nm to 550 nm. When the material of the active layer 103b includes AlGaN series, the emitted light may be an ultraviolet light with a peak wavelength of 250 nm to 400 nm. In an embodiment, the material of the active layer 103b includes a ternary III-V semiconductor material such as $In_xGa_{1-x}As$, in which $0<x<1$, the material of the first-conductivity-type semiconductor layer 103a includes a ternary III-V semiconductor material such as $Al_yGa_{1-y}As$, in which 0<y<1, and the material of the second-conductivity-type semiconductor layer 103c includes a ternary III-V group semiconductor material such as $Al_zGa_{1-z}As$, in which 0<z<1.

In an embodiment, when the semiconductor device 10 is a photodiode chip, the wavelength range of the light absorbed by the active layer 103b is determined based on the material (or the band gap) of the active layer 103b. The active layer 103b can absorb lights with energy greater than its band gap. For example, the band gap of the active layer 103b can be designed to be between 0.72 ev and 1.77 ev (which corresponds to infrared light with a wavelength between 700 nm and 1700 nm), between 1.77 ev and 2.03 ev (which corresponds to red light with a wavelength between 610 nm and 700 nm), between 2.1 ev and 2.175 ev (which corresponds to yellow light with a wavelength between 570 nm and 590 nm), between 2.137 ev and 2.48 ev (which corresponds to green light with a wavelength between 500 nm and 580 nm), between 2.53 ev and 3.1 ev (which corresponds to blue light or deep blue light with a wavelength between 400 nm and 490 nm), or between 3.1 ev and 4.96 ev (which corresponds to ultraviolet light with a wavelength between 250 nm and 400 nm). Specifically, when the compound semiconductor element 10 is a photodiode chip, the active layer 103b may include group III-V compound semiconductors, such as GaAs, InP, InGaAs, AlGaAs, AlGaInAs, GaP, InGaP, AlInP, AlGaInP, GaN, InGaN, AlGaN, AlGaInN, AlAsSb, InGaAsP, InGaAsN or AlGaAsP.

The material of the semiconductor contact layer 104 may be different from the material of the second-conductivity-type semiconductor layer 103c. In some embodiments, the material of the semiconductor contact layer 104 includes a binary III-V semiconductor material such as GaAs, and the semiconductor contact layer 104 may have the same conductivity type as the second-conductivity-type semiconductor layer 103c. The thickness of the semiconductor contact layer 104 may be in the range of 5 nm to 50 nm. In some embodiments, in order to prevent the semiconductor contact layer 104 from absorbing the light emitted by the active layer 103b so as to affect the luminous efficiency, the thickness of the semiconductor contact layer 104 can be set as below 1 nm and/or the area of the ring-shaped semiconductor contact layer 104 viewed from above can be set to 10% or less of the area of the active layer 103b, for example, the area can be in the range of 2% to 5%.

In the foregoing embodiments, the first electrode 105 and the second electrode 106 may include a single-layer or a multi-layer metal structure. The first electrode 105 and the second electrode 106 may include a material selected from nickel (Ni), titanium (Ti), platinum (Pt), palladium (Pd), silver (Ag), gold (Au), aluminum (Al) and copper (Cu). The first electrode 105 is in direct contact with the semiconductor contact layer 104 and forms an interface having a first resistance R1 with the semiconductor contact layer 104. For example, the first electrode 105 and the semiconductor contact layer 104 forms an ohmic contact. The first electrode 105 is in direct contact with the second-conductivity-type semiconductor layer 103c and forms an interface having a second resistance R2 with the second-conductivity-type semiconductor layer 103c. The second resistance R2 is greater than the first resistance R1, so that current mainly flows into (or flows out from) the first electrode 105 through the semiconductor contact layer 104.

In the foregoing embodiments, the insulating layer 107 includes a dielectric material, such as tantalum oxide ($TaO_x$), aluminum oxide ($AlO_x$), silicon dioxide ($SiO_x$), titanium oxide ($TiO_x$), silicon nitride ($SiN_x$), niobium oxide ($Nb_2O_5$) or spin-on glass (SOG). In an embodiment, the insulating layer 107 includes a distributed Bragg reflector (DBR) structure. The DBR structure may include a plurality of first dielectric layers and a plurality of second dielectric layers that are alternately stacked. The first dielectric layer and the second dielectric layer have different refractive indexes. In an embodiment, the semiconductor device 10 is a flip-chip type light-emitting diode (in which the light generated by the semiconductor device 10 is emitted through the base 100), and the insulating layer 107 (e.g. the DBR structure) may help to reflect the light towards the base 100 so as to increase the efficiency of the semiconductor device 10. In an embodiment, the upper surface of the insulating layer 107 may have an average roughness (Ra) of less than 0.1 μm such as less than 0.05 μm. When the semiconductor device 10 is a light-emitting diode chip, it may have a viewing angle of 140° or more in a light field analysis when being driven, so that the light-emitting diode chip may be suitable for applications requiring wide viewing angles.

Specifically, the semiconductor device and the semiconductor component can be applied to products in various fields, such as illumination, medical care, display, communication, sensing, or power supply system. For example, the semiconductor device or the semiconductor component can be used in a light fixture, monitor, mobile phone, or tablet, an automotive instrument panel, a television, computer, optical mouse, wearable device (such as watch, bracelet or necklace), traffic sign, outdoor display device, or medical device.

It should be realized that each of the embodiments mentioned in the present disclosure is only used for describing the present disclosure, but not for limiting the scope of the present disclosure. Any obvious modification or alteration is not departing from the spirit and scope of the present disclosure. Furthermore, above-mentioned embodiments can be combined or substituted under proper condition and are not limited to specific embodiments described above. A connection relationship between a specific element and another element specifically described in an embodiment may also be applied in another embodiment and is within the scope as claimed in the present disclosure.

What is claimed is:

1. A semiconductor device, comprising:
an active structure having a first-conductivity-type semiconductor layer, a second-conductivity-type semiconductor layer, and an active layer located between the first-conductivity-type semiconductor layer and the second-conductivity-type semiconductor layer;
a ring-shaped semiconductor contact layer located on the second-conductivity-type semiconductor layer and having a first inner sidewall and a first outer sidewall;
a first electrode having an upper surface and covering the ring-shaped semiconductor contact layer; and
an insulating layer covering the first electrode and the active structure and having a second inner sidewall and a second outer sidewall;
wherein the second-conductivity-type semiconductor layer has a protruding portion having a third sidewall and the first electrode is located on the protruding portion and has a fourth sidewall, the first inner sidewall is not flush with the second inner sidewall in a vertical direction, and the insulating layer covers the upper surface of the first electrode, the fourth sidewall, the third sidewall and the active structure.

2. The semiconductor device of claim 1, wherein the first outer sidewall is not flush with the second inner sidewall in the vertical direction.

3. The semiconductor device of claim 1, wherein the first inner sidewall defines a first geometric shape having a first width, the second inner sidewall defines a second geometric shape having a second width, and the first width is larger than 90% of the second width.

4. The semiconductor device of claim 1, wherein the first inner sidewall is separated from the second inner sidewall by a distance L in a horizontal direction, and 0 μm<the distance L<5 μm.

5. The semiconductor device of claim 1, wherein the second inner sidewall is overlapped with the ring-shaped semiconductor contact layer in the vertical direction.

6. The semiconductor device of claim 1, wherein the third sidewall is flush with the fourth sidewall.

7. The semiconductor device of claim 1, wherein the second-conductivity-type semiconductor layer further has a bottom portion under the protruding portion, the bottom portion has a third width and the protruding portion has a fourth width less than the third width.

8. The semiconductor device of claim 1, wherein the insulating layer covers 30% or less of an area of the upper surface of the first electrode.

9. The semiconductor device of claim 1, wherein the second inner sidewall defines a second geometric shape having a second width, and the first inner sidewall is separated from the second inner sidewall by a distance L in a horizontal direction, and the distance L is less than 5% of the second width.

10. The semiconductor device of claim 1, wherein the ring-shaped semiconductor contact layer has an open ring shape.

11. The semiconductor device of claim 10, wherein the ring-shaped semiconductor contact layer includes a plurality of island structures which are separated from each other.

12. The semiconductor device of claim 1, wherein the ring-shaped semiconductor contact layer has a circular ring shape or a rectangular ring shape.

13. The semiconductor device of claim 1, wherein the ring-shaped semiconductor contact layer has a closed ring shape.

14. The semiconductor device of claim 1, wherein the first inner sidewall and the second inner sidewall have the same shape.

15. The semiconductor device of claim 1, wherein the first inner sidewall defines a first geometric shape having a first width, the second inner sidewall defines a second geometric shape having a second width, and the second width is larger than the first width.

16. The semiconductor device of claim 1, wherein the ring-shaped semiconductor contact layer is surrounded by the first electrode.

17. The semiconductor device of claim 1, wherein the ring-shaped semiconductor contact layer and the insulating layer are not in direct contact.

18. A semiconductor component, comprising:
a semiconductor device, comprising:
an active structure having a first-conductivity-type semiconductor layer, a second-conductivity-type semiconductor layer, and an active layer located between the first-conductivity-type semiconductor layer and the second-conductivity-type semiconductor layer;
a ring-shaped semiconductor contact layer located on the second-conductivity-type semiconductor layer and having a first inner sidewall and a first outer sidewall;
a first electrode having an upper surface and covering the ring-shaped semiconductor contact layer; and
an insulating layer covering the first electrode and the active structure and having a second inner sidewall and a second outer sidewall; and
a welding wire having a bonded portion bonded to the first electrode;
wherein the second-conductivity-type semiconductor layer has a protruding portion having a third sidewall and the first electrode is located on the protruding portion and has a fourth sidewall, the first inner sidewall is not flush with the second inner sidewall in a vertical direction, and the insulating layer covers the upper surface of the first electrode, the fourth sidewall, the third sidewall and the active structure.

19. The semiconductor component of claim 18, wherein the bonded portion has a bonding width, the first inner sidewall defines a first geometric shape having a first width, the second inner sidewall defines a second geometric shape having a second width, and the second width is larger than the bonding width.

20. The semiconductor component of claim 19, wherein the first width is larger than 90% of the second width.

* * * * *